United States Patent
Chen

(10) Patent No.: US 7,609,094 B2
(45) Date of Patent: Oct. 27, 2009

(54) INPUT CIRCUITS AND METHODS THEREOF

(75) Inventor: Pi Fen Chen, Hsinchu (TW)

(73) Assignee: Mediatek Inc., Hsin-Chu (TW)

( * ) Notice: Subject to any disclaimer, the term of this patent is extended or adjusted under 35 U.S.C. 154(b) by 25 days.

(21) Appl. No.: 11/766,351

(22) Filed: Jun. 21, 2007

(65) Prior Publication Data

US 2008/0007294 A1 Jan. 10, 2008

Related U.S. Application Data

(60) Provisional application No. 60/805,606, filed on Jun. 23, 2006.

(51) Int. Cl.
*H03K 5/22* (2006.01)
(52) U.S. Cl. .......................... 327/66; 327/362; 327/65; 327/211
(58) Field of Classification Search ................. 327/199, 327/211, 218, 362, 65; 369/59.17, 59.16, 369/124.13
See application file for complete search history.

(56) References Cited

U.S. PATENT DOCUMENTS

| 6,255,863 | B1 * | 7/2001 | Yamauchi et al. ............. 327/65 |
| 6,646,487 | B2 * | 11/2003 | Nedovic et al. ............. 327/211 |
| 6,847,601 | B2 * | 1/2005 | Kanai et al. ............. 369/59.17 |
| 7,443,231 | B2 * | 10/2008 | Chang ........................ 327/539 |
| 7,463,868 | B2 * | 12/2008 | Rofougaran et al. ......... 455/118 |
| 2006/0109040 | A1 * | 5/2006 | Clerc ......................... 327/199 |
| 2006/0152267 | A1 * | 7/2006 | Ramprasad ................. 327/208 |

* cited by examiner

*Primary Examiner*—Vibol Tan
(74) *Attorney, Agent, or Firm*—Thomas, Kayden, Horstemeyer & Risley

(57) ABSTRACT

An input circuit comprising a level-determining unit and an output unit is provided. In a first period controlled by a first enable signal, the level-determining unit receives an input signal at an input terminal of the input circuit and determines a voltage level of the input signal. The output unit is coupled to the input terminal. In the first period, the output unit outputs the input signal with the determined voltage level at an output terminal of the input circuit to serve as an output signal. In a second period following the first period, the output unit latches the determined voltage level of the input signal according to a second enable signal and outputs the input signal with the determined voltage level at the output terminal to serve as the output signal.

24 Claims, 7 Drawing Sheets

INPUT CIRCUITS AND METHODS THEREOF

CROSS REFERENCE TO RELATED APPLICATIONS

The present application claims the benefit of U.S. provisional application Ser. No. 60/805,606, filed Jun. 23, 2006, entitled "LEAKAGE-FREE TRI-STATE OR TWO-STATE (INCLUDING FLOATING STATE) INPUT PAD", the contents which are incorporated herein by reference.

BACKGROUND OF THE INVENTION

1. Field of the Invention

The invention relates to an input circuit, and more particularly to an input circuit determining two states or three states at an input pin.

2. Description of the Related Art

Logic input pins of integrated circuits (ICs) generally have two logic states, such as high and low logic states, according input signals. In some applications, logic input pins may have a floating state, representing that the logic input pins receive no signals. Thus, a conventional input circuit is provided to determine two states of an input pin, such as a floating state and a high logic state or a floating state and a low logic state, and further to determine three states thereof, such as a floating state, high and low logic states. When an input pin is at a floating state, the conventional input circuit pulls a level of the input pin high or low through a resistor. For example, when an input pin has a floating state and a high logic state and the input pin is at the floating state, a conventional input circuit pulls a level of the input pin low through a resistor coupled between the input pin and a ground and determines the level of the input pin is low. When the input pin is at the high logic state, the above conventional input circuit determines the level of the input pin is high. However, leakage current is generated on a path formed by the resistor between the input pin and the ground. Thus, it is desired to provide an input circuit that can determine a floating state of an input pin and decrease leakage current when the input pin is at a low or high logic state.

BRIEF SUMMARY OF THE INVENTION

Input circuits are provided. An exemplary embodiment of an input circuit comprises a level-determining unit and an output unit. In a first period controlled by a first enable signal, the level-determining unit receives an input signal at an input terminal of the input circuit and determines a voltage level of the input signal. The output unit is coupled to the input terminal. In the first period, the output unit outputs the input signal with the determined voltage level at an output terminal of the input circuit to serve as an output signal. In a second period controlled by a second enable signal, the output unit latches the determined voltage level of the input signal and outputs the input signal with the determined voltage level at the output terminal to serve as the output signal.

An exemplary embodiment of an input circuit comprises a level-determining unit, an analog-digital converting unit, and a latch module. The level-determining unit receives an input signal at an input terminal of the input circuit and determines a voltage level of the input signal. The timing of the first period is controlled by a first enable signal. The analog-digital converting unit receives the input signal with the determined voltage level and converts the input signal to a digital signal according to the determined voltage level of the input signal in the first period. The latch module latches the digital signal according to a second enable signal in a second period following the first period to serve as an output signal. Thus, a state of the input terminal is determined according to the output signal.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
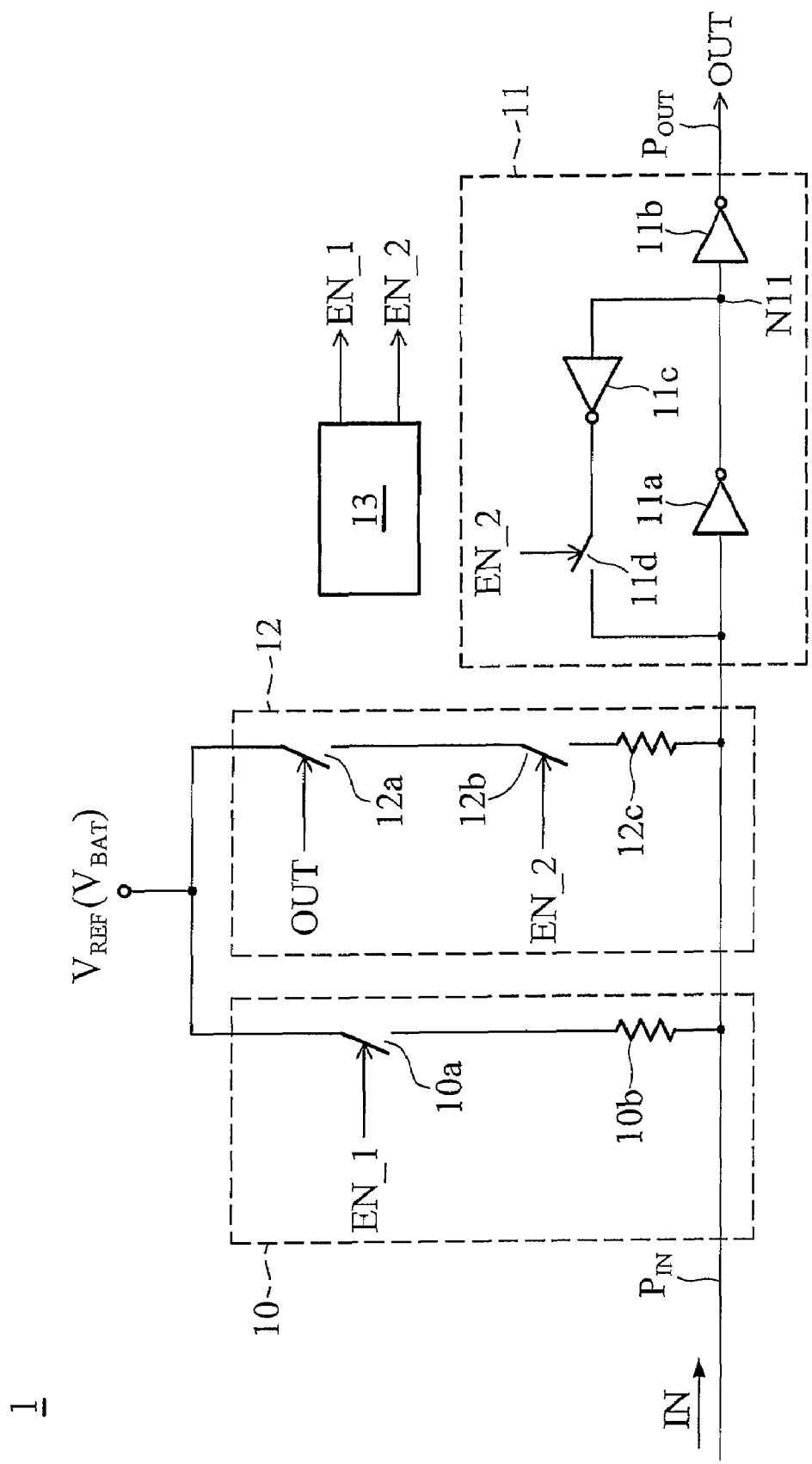
FIG. 1 shows an exemplary embodiment of an input circuit.

In an exemplary embodiment of an input circuit shown in FIG. 1, an input circuit 1 determines two states of an input terminal. The input circuit 1 comprises a level-determining unit 10 and an output unit 11. The input terminal can be a logic input pin of an integrated circuit (IC). The level-determining unit 10 receives an input signal IN at an input terminal $P_{IN}$ of the input circuit 1 and determines a voltage level of the input signal IN controlled by an enable signal EN_1 in a first period. In the first period, the output unit 11 outputs the input signal IN with the determined voltage level at an output terminal $P_{OUT}$ of the input circuit 1 to serve as an output signal OUT. In a second period controlled by an enable signal EN_2, the output unit 11 latches the determined voltage level of the input signal IN and outputs the input signal IN with the determined voltage level at the output terminal $P_{OUT}$ to serve as the output signal OUT. According to the output signal OUT, the state of the input terminal $P_{IN}$ can be obtained.

In this embodiment, signals have high voltage levels or low voltage levels according to a reference level. In digital, the high voltage levels correspond to logic high levels, and the low voltage levels correspond to logic low levels.

In the invention, the two states of the input terminal $P_{IN}$ can be a floating state and a high logic state or a floating state and a low logic state. In the following description, the floating state and low logic state of the input terminal $P_{IN}$ are given as an example to illustrate the embodiment shown in FIG. 1. As shown in FIG. 1, the input circuit 1 further comprises a level keeping unit 12. The level keeping unit 12 keeps a voltage value at the input terminal $P_{IN}$ controlled by the enable signal EN_2 in the second period. The level keeping unit 12 prevents the voltage value of the input terminal $P_{IN}$ from noise interference when the input terminal $P_{IN}$ is at a floating state. The input circuit 1 also comprises a timing generating unit 13 for generating the enable signals EN_1 and EN_2. The enable signal EN_1 is complementary to the enable signal EN_2.

Referring to FIG. 1, the level-determining unit 10 comprises a switch 10a and a resistor 10b. The switch 10a is controlled by the enable signal EN_1. A first terminal of the switch 10a is coupled to a reference voltage $V_{REF}$. In this embodiment, because the two states of the input terminal $P_{IN}$ are the floating state and the low logic state, the reference voltage $V_{REF}$ is a power voltage. Conversely, if the two states of the input terminal $P_{IN}$ are a floating state and a high logic state, the reference voltage $V_{REF}$ is a ground voltage. A first terminal of the resistor 10b is coupled to second terminal of the switch 10a, and a second terminal thereof is coupled to the input terminal $P_{IN}$.

Referring to FIG. 1, the output unit 11 comprises inverters 11a, 11b, and 11c and a switch 11d. The inverters 11a and 11b are coupled in series. As shown in FIG. 1, the inverter 11a is coupled between a node N11 and the input terminal $P_{IN}$, and the inverter 11b is coupled between the output terminal $P_{OUT}$ and the node N11. The switch 11d is controlled by the enable signal EN_2 and coupled to the inverter 11c between the input terminal $P_{IN}$ and the node N11.

The level keeping unit 12 comprises switches 12a and 12b, and a resistor 12c which are coupled in series between the reference voltage $V_{REF}$ and the input terminal $P_{IN}$. The switch 12a is controlled by the output signal OUT, and the switch 12b is controlled by the enable signal EN_2. In another embodiment, $V_{REF}$ is ground and the switch 12a is controlled by a complementary of the output signal OUT.

Figure 2:
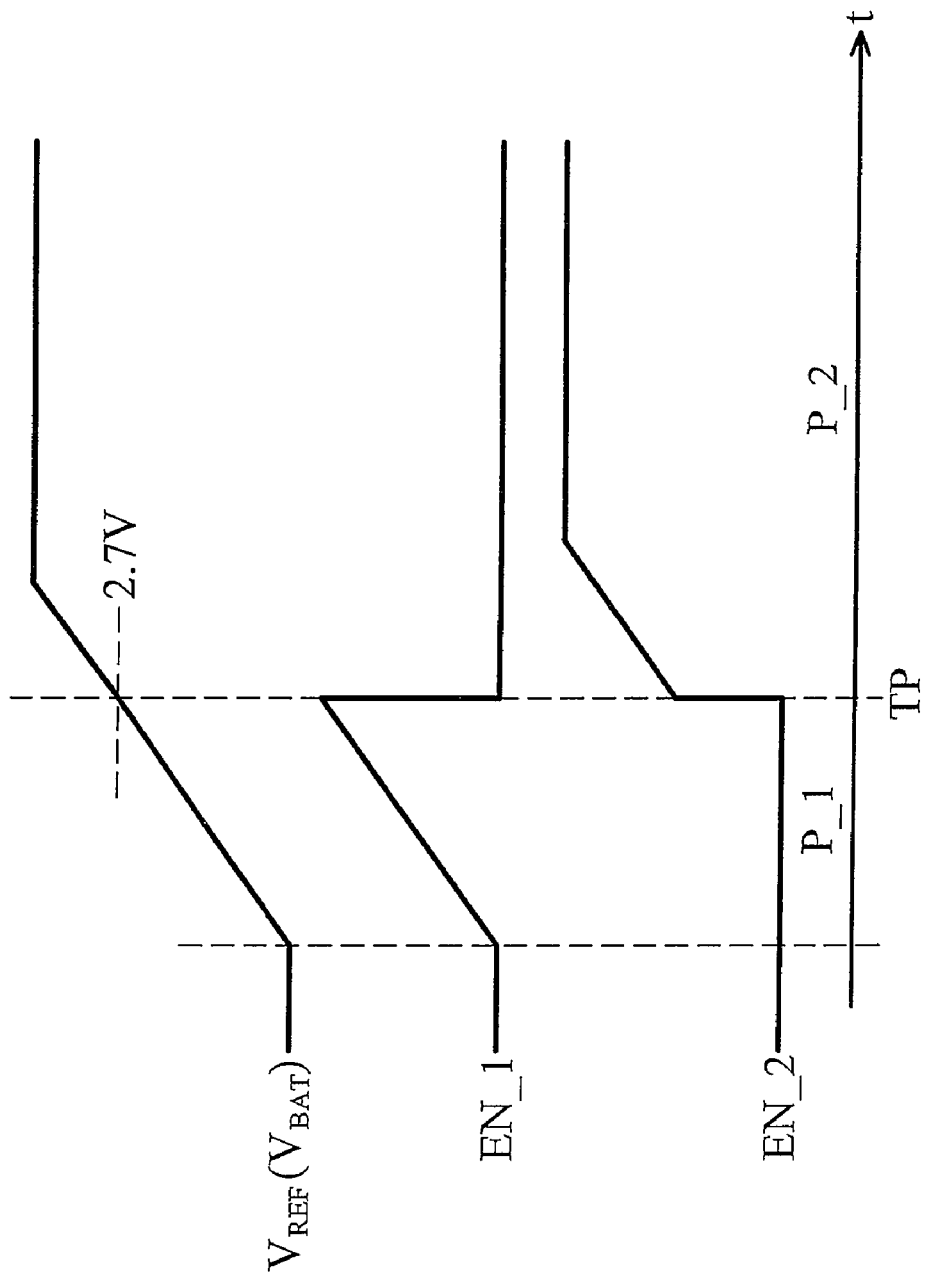
FIG. 2 shows the relationship between the reference voltage $V_{REF}$ and the enable signals EN_1 and EN_2.

FIG. 2 shows the relationship between the reference voltage $V_{REF}$ and the enable signal EN_1. The operation of the input circuit 1 is described with FIGS. 1 and 2. In this embodiment, all the switches are turned on by a high voltage level signal and turned off by a low voltage level signal.

Referring to FIG. 2, in a first period P_1, the reference voltage $V_{REF}$ rises from 0V and has a high voltage level, and the enable signal EN_1 follows $V_{REF}$, rising to the reference voltage $V_{REF}$. When the enable signal EN_1 reaches to a high voltage level to turn on the switch 10a, a first path between the reference voltage $V_{REF}$ and the input terminal $P_{IN}$ is formed in the level-determining unit 10. If the input terminal $P_{IN}$ is at a floating state, the input signal IN is pulled high according to the reference voltage $V_{REF}$ through the first path. The level-determining unit 10 determines a voltage logic level of the input signal IN as the high voltage level. In other words, the level-determining unit 10 determines the voltage level of the input signal IN as the voltage level of the reference voltage $V_{REF}$. In the first period P_1, the switch 11d is turned off by the enable signal EN_2 complementary to the enable signal EN_1, and the input signal IN with the high voltage level is output to the output terminal $P_{OUT}$ to serve as the output signal OUT through the inverters 11a and 11b. Because the switch 12b is also turned off by the enable signal EN_2, the level keeping unit 12 is inactive.

When the reference voltage $V_{REF}$ rises to a predetermined voltage, such as 2.7V, the enable signal EN_1 switches to a low voltage level to turn off the switch 10a, and the enable signal EN_2 switches to a high voltage level to turn on the switch 11d. Referring to FIG. 2, the time at which the enable signal EN_1 switches to the low voltage level is marked as a label "TP", and a period after the time TP refers to a second period P_2. In the second period P_2, the high voltage level of the input signal IN is latched by the inverters 11a and 11c, and the input signal IN with the high voltage level is output to the output terminal $P_{OUT}$ to serve as the output signal OUT through the inverters 11a and 11b. Thus, according to the high voltage level output signal OUT, it is determined that the input terminal $P_{IN}$ is in the floating state.

Moreover, in the second period P_2, the first path is cut off due to the turned-off switch 10a. Because the switches 12a and 12b are turned on respectively by the output signal OUT and the enable signal EN_2, a second path between the reference voltage $V_{REF}$ and the input terminal $P_{IN}$ is formed in the level keeping unit 12. The second path is used to weakly pull high a voltage value of the high voltage level of the input signal IN, preventing the voltage value of the high voltage level of the input signal IN from noise interference.

In the first period P_1, if the input terminal $P_{IN}$ is at a low logic state, the input signal IN is at the low voltage level. The level-determining unit 10 thus determines the voltage level of the input signal IN as the low voltage level. Because the switch 11d is turned off by the enable signal EN_2, the input signal IN with the low voltage level is output to the output terminal $P_{OUT}$ to serve as the output signal OUT through the inverters 11a and 11b. The level keeping unit 12 is inactive and the second path is cut off due to the turned-off switch 12b. Leakage current would be generated in the first path due to the turned-on switch 10a in the first period P_1.

Then, in the second period P_2, the enable signal EN_1 switches to the low voltage level to turn off the switch 10a. The first path is thus cut off, and there is no leakage current in the first path. The enable signal EN_2 switches to the high voltage level to turn on the switch 11d, the low voltage level of the input signal IN is latched by the inverters 11a and 11c, and the input signal IN with the low voltage level is output to the output terminal $P_{OUT}$ to serve as the output signal OUT through the inverters 11a and 11b. Thus, according to the low voltage level output signal OUT, it is determined that the input terminal $P_{IN}$ is in the low logic state.

Moreover, in the second period P_2, because the switch 12a is turned off by the output signal OUT with a low voltage level, the level keeping unit 12 is also inactive, and the second path is cut off. In the condition that the input signal IN is at the low voltage level, because the first and second paths are both cut off in the second period P_2, there would be no leakage current during the second period P_2.

In some embodiments, when the two states of the input terminal $P_{IN}$ are a floating state and a high logic state, the reference voltage $V_{REF}$ is a ground voltage with a low voltage level. If the input terminal $P_{IN}$ is at a floating state, the input signal IN is pulled low according to the reference voltage $V_{REF}$ through the first path in the level-determining unit 10. The level-determining unit 10 thus determines the voltage level of the input signal IN as a low voltage level. If the input terminal $P_{IN}$ is at a high logic state, the level-determining unit 10 determines the voltage level of the input signal IN as a high voltage level.

Figure 3:
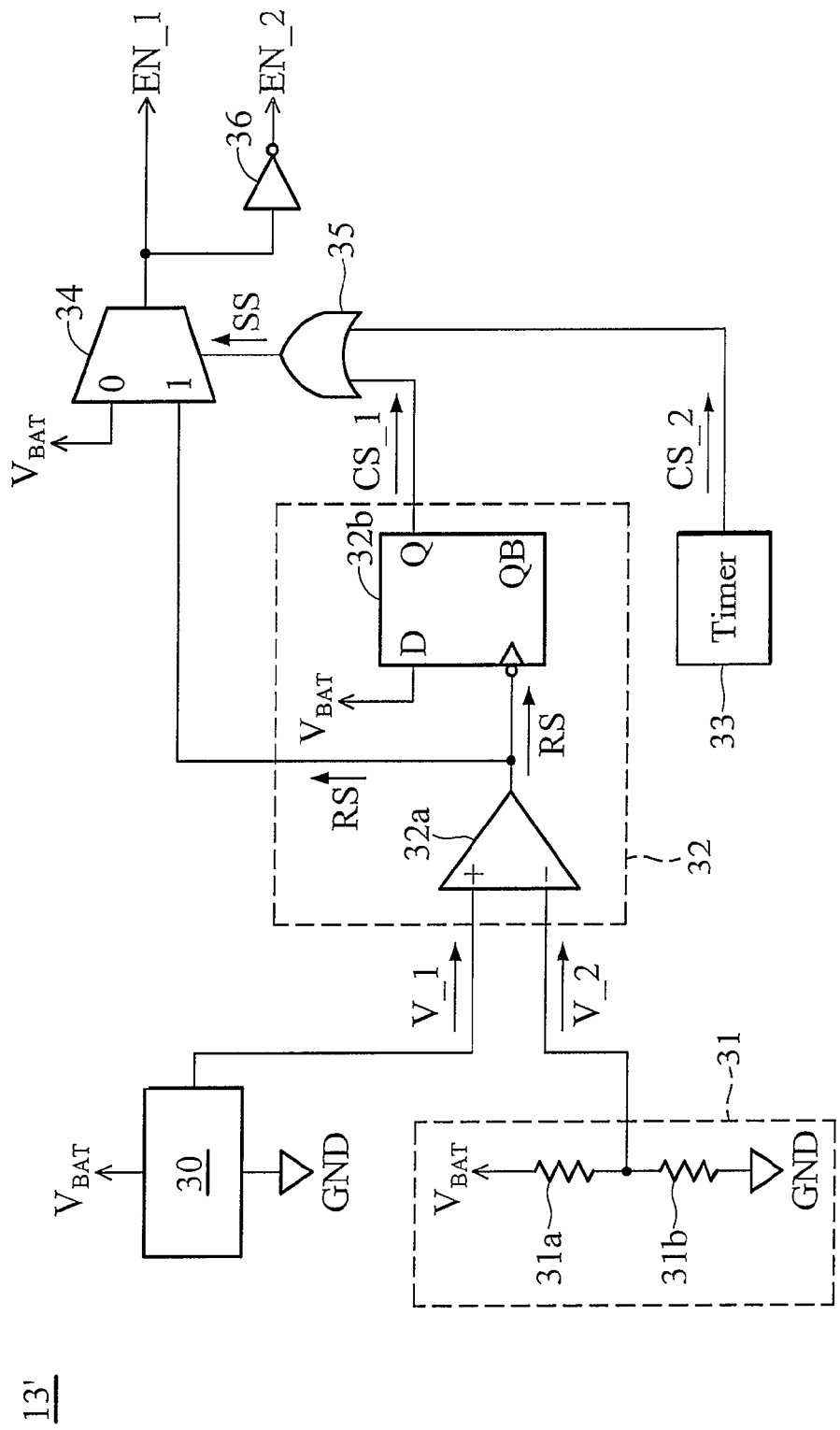
FIG. 3 shows an exemplary embodiment of a timing generating unit.
Figure 4:
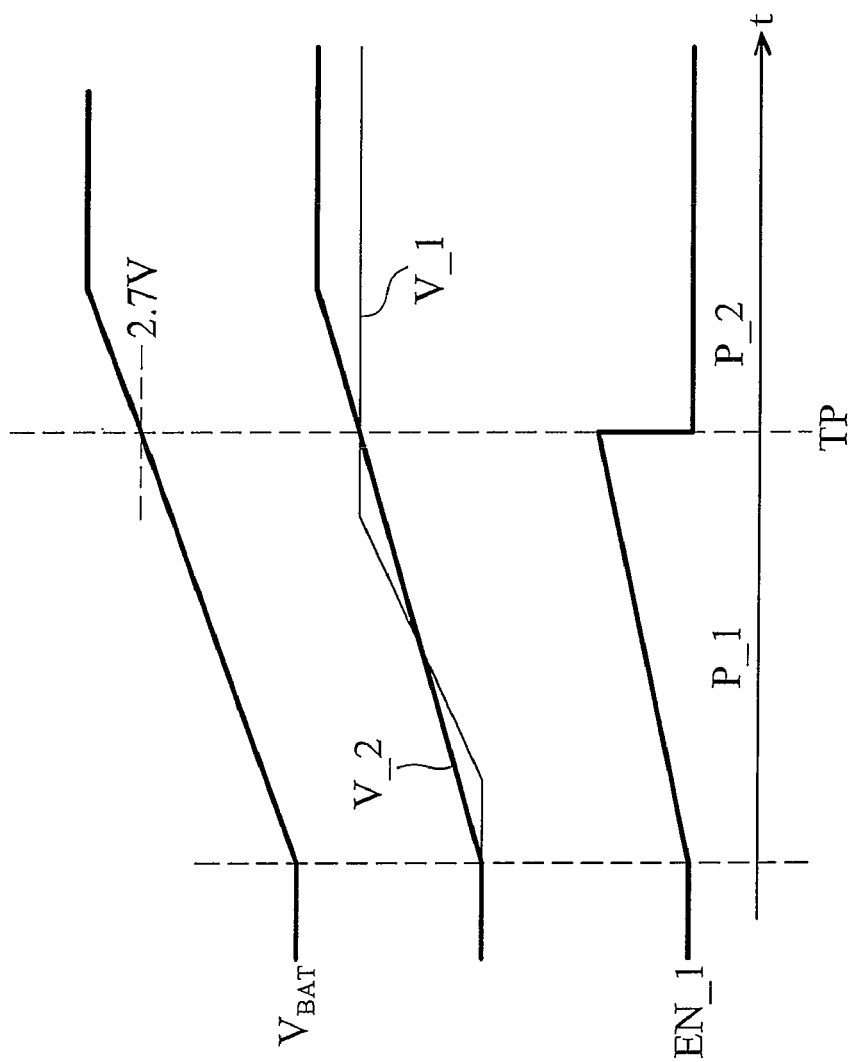
FIG. 4 shows a power voltage $V_{BAT}$ rising slowly and the relationship between the power voltage $V_{BAT}$ and the enable signal EN_1.

As described, the transition of the enable signals EN_1 and EN_2 is determined according to a power voltage. FIG. 3 shows an exemplary embodiment of the timing generating unit 13 in FIG. 1. The timing generating unit 13' comprises a voltage generator 30, a voltage divider 31, a comparing unit 32, a timer 33, a multiplexer 34, an OR gate 35, and an inverter 36. The voltage divider 31 comprises resistors 31a and 31b. The comparing unit 32 comprises a comparator 32a and a D flip-flop 32b, wherein the D flip-flop 32b is active by a falling edge and generates a control signal CS_1 initially having the low voltage level. The timer 33 generates a control signal CS_2 initially having the low voltage level. The voltage generator 30 receives a power voltage $V_{BAT}$ and generates a voltage V_1. In this embodiment, the voltage generator 30 can be a bandgap voltage generator. In the voltage divider 31, two resistors 31a and 31b are coupled in series between the power voltage $V_{BAT}$ and a ground voltage GND. The voltage divider 31 generates a voltage V_2 according to a predetermined ratio of the difference voltage between the power voltage $V_{BAT}$ and the ground voltage GND. The predetermined ratio is determined according to resistance of the resistors 31a and 31b. A non-inverting terminal (+) of the comparator 32a receives the voltage V_1, and an inverting terminal (−) thereof receives the voltage V_2. It is assumed that the power voltage $V_{BAT}$ rises slowly, such as rising time>1 ms, as shown in FIG. 4. The comparator 32a compares the voltages V_1 and V_2, generates a result signal RS, and changes a voltage level of the result signal RS according to the compared result. One terminal of the multiplexer 34 receives the result signal RS, the other terminal thereof receives the power voltage $V_{BAT}$. In the first period P_1, at beginning, the voltage V_2 is larger than the voltage V_1, and the comparator 32a changes the result signal RS to a low voltage level. Then, the voltage V_2 becomes less than the voltage V_1, the comparator 32a changes the result signal RS to a high voltage level. Because the D flip-flop 32b changes state at falling edges of RS, the voltage level of the control signal CS_1 remains low. The OR gate 35 receives the control signals CS_1 and CS_2 both with the low voltage level and outputs a select signal SS with the low voltage level to the multiplexer 34. The multiplexer 34 then outputs the power voltage $V_{BAT}$ to serve as the enable signal EN_1. In other words, in the first period P_1, the enable signal EN_1 follows the power voltage $V_{BAT}$. The inverter 36 receives and inverts the enable signal EN_1, and outputs the inverted enable signal EN_1 to serve as the enable signal EN_2.

After the time TP, that is in the second period P_2, the voltage V_2 becomes larger than the voltage V_1, the comparator 32a changes the result signal RS to a low voltage level at the time TP as the power voltage $V_{BAT}$ is 2.7V. Because the result signal RS is changed from a high voltage level to a low voltage level, a falling edge occurs in the result signal RS. The D flip-flop 32 is thus triggered, and the voltage level of the control signal CS_1 becomes high as the power voltage $V_{BAT}$. The OR gate 35 receives the control signal CS_1 with the high voltage level and the control signal CS_2 with a low voltage level and outputs the select signal SS with a high voltage level to the multiplexer 34. The multiplexer 34 then outputs the result signal RS with a low voltage level to serve as the enable signal EN_1. Thus, the voltage level of the enable signal EN_1 is changed from high to low at the time TP as the power voltage $V_{BAT}$ is 2.7V. The inverter 36 receives and inverts the enable signal EN_1 with the low voltage level, and outputs the inverted enable signal EN_1 to serve as the enable signal EN_2. Noted that the control signal CS_2 initially has a low voltage level. When the timer 33 reaches the time TP and the control signal CS_1 is not yet at a high voltage level, the timer 33 changes the control signal CS_2 to a high voltage level, so that the multiplexer 34 outputs the result signal RS to serve as the enable signal EN_1.

Figure 5:
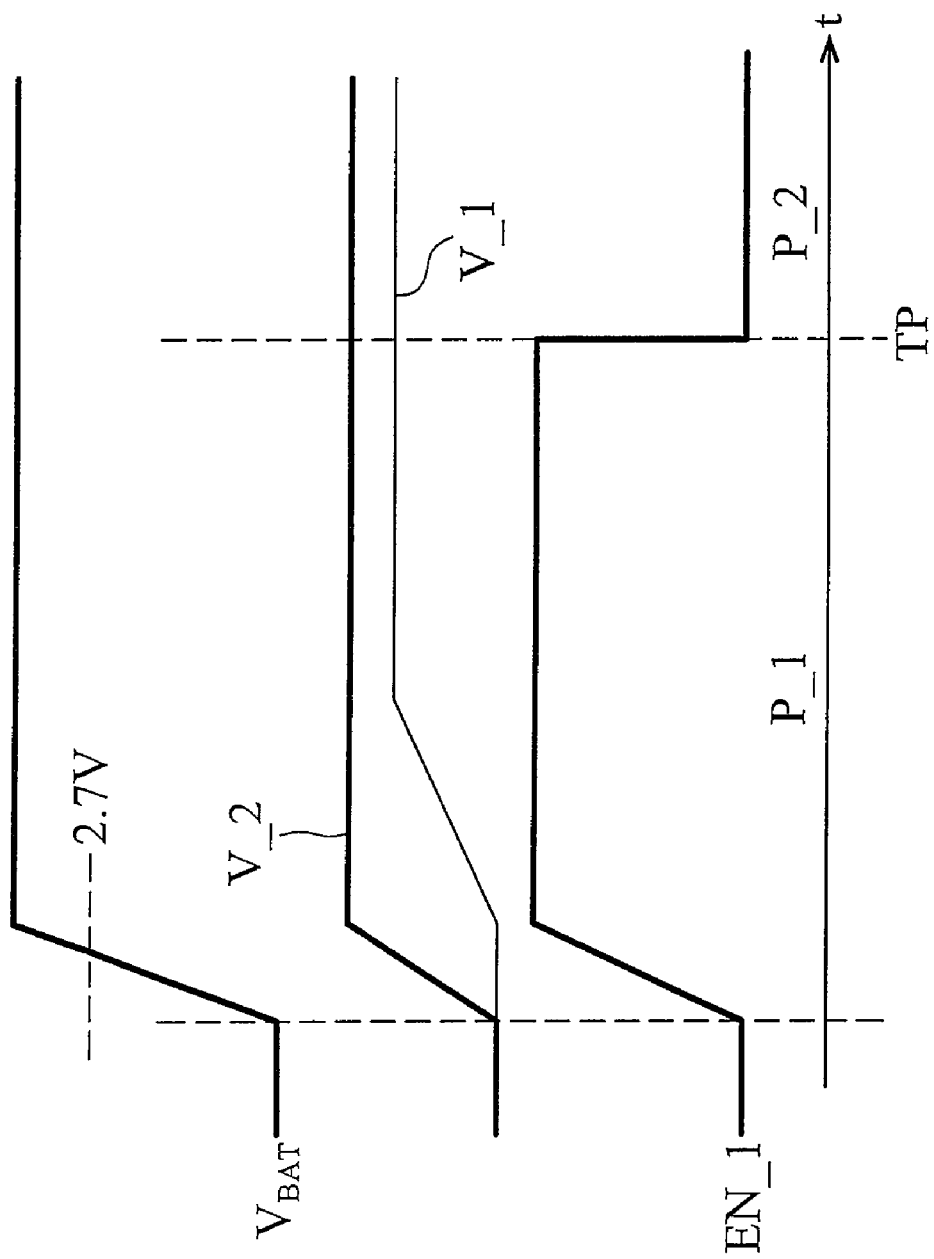
FIG. 5 shows a power voltage $V_{BAT}$ rising fast and the relationship between the power voltage $V_{BAT}$ and the enable signal EN_1.

If the power voltage $V_{BAT}$ rises fast, as shown in FIG. 5, the voltage V_2 is always greater than the voltage V_1 because the voltage V_1 generated by the voltage generator 30 is not able to rise rapidly. The comparator 32a always generates the result signal RS with the low voltage level. The D flip-flop 32 is always not triggered, and the voltage level of the control signal CS_1 is always low. The OR gate 35 receives the control signals CS_1 and CS_2 both with low voltage levels and outputs the select signal SS with low voltage levels to the multiplexer 34. The multiplexer 34 then outputs the power voltage $V_{BAT}$ to serve as the enable signal EN_1. The inverter 36 receives and inverts the enable signal EN_1, and outputs the inverted enable signal EN_1 to serve as the enable signal EN_2. Thus, the voltage level of the enable signal EN_1 is not changed from high to low as the power voltage $V_{BAT}$ is 2.7V. In this condition, the timer 33 continuously counts time. When the timer 33 reaches the time TP, the timer 33 directly changes the control signal CS_2 to a high voltage level, so that the multiplexer 34 outputs the result signal RS to serve as the enable signal EN_1.

Figure 6:
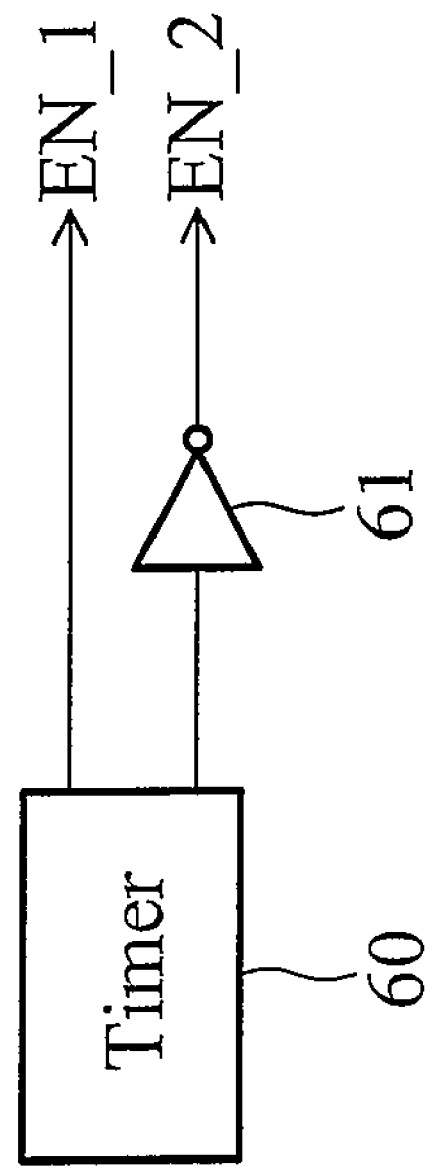
FIG. 6 shows an exemplary embodiment of a timing generating unit.

In some embodiments, the timing generating unit 13 can be simplified. FIG. 6 shows another exemplary embodiment of the timing generating unit 13 in FIG. 1. The timing generating unit 13" comprises a timer 60 and an inverter 61. The timer 60 generates the enable signal EN_1. When the timer 60 reaches the time TP between the first and second periods P_1 and P_2, the timer 60 changes the voltage level of the enable signal EN_1 to a low voltage level. The inverter 31 receives and inverts the enable signal EN_1, and outputs the inverted enable signal EN_2 to serve as the enable signal EN_2.

In some embodiments, when the input circuit 1 is applied in an IC, the enable signals EN_1 and EN_2 are internally generated from the IC.

Figure 7:
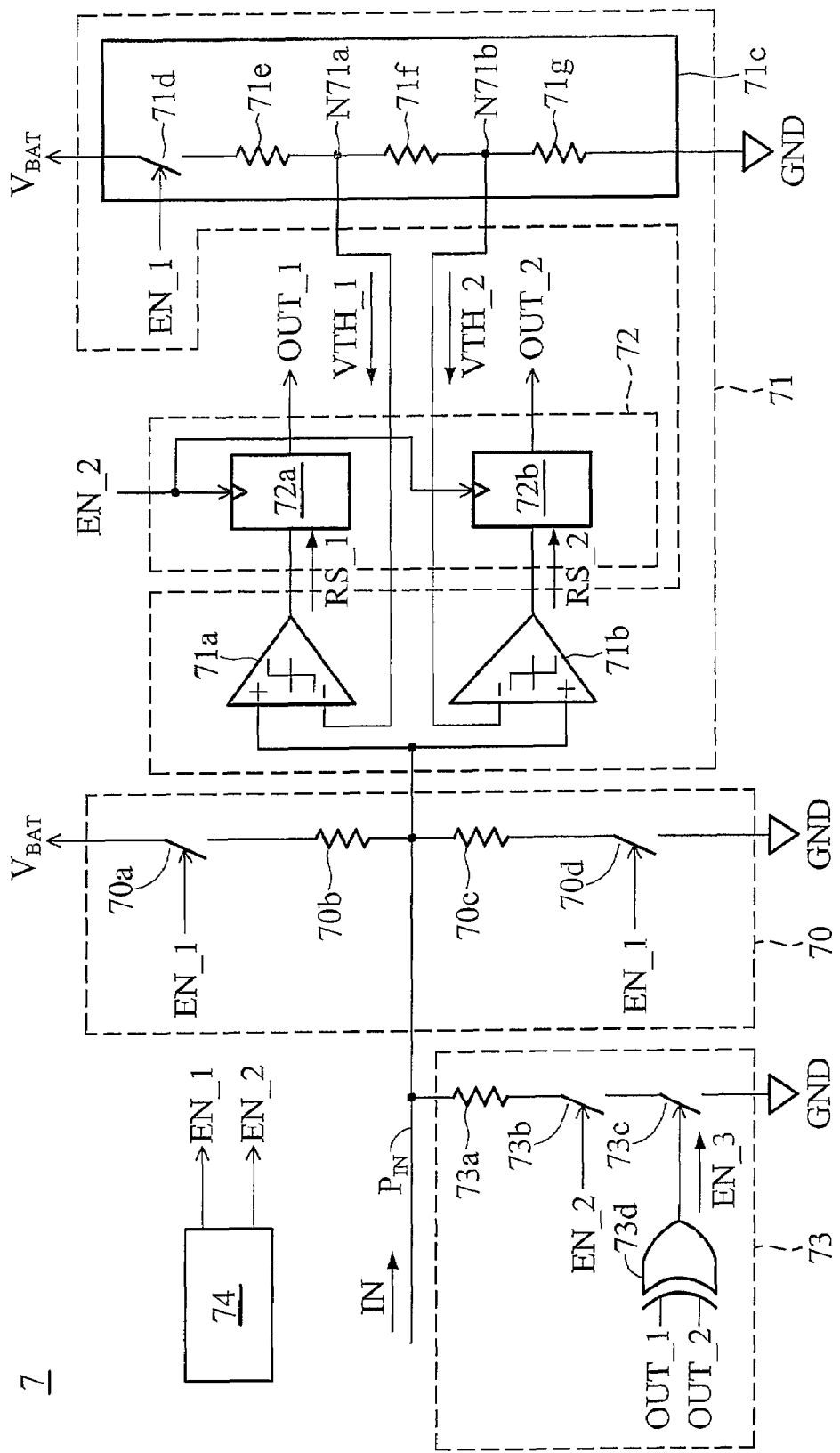
FIG. 7 shows an exemplary embodiment of an input circuit.

In an exemplary embodiment of an input circuit in FIG. 7, an input circuit 7 can determine 3 states (floating state, high and low logic states) of an input terminal and comprises a level-determining unit 70, an analog-digital converting unit 71, and a latch module 72. The input terminal can be a logic input pin of an integrated circuit (IC). The level-determining unit 70 receives an input signal IN at an input terminal $P_{IN}$ of the input circuit 7 and determines a voltage level of the input signal IN when the enable signal EN_1 is high. The analog-digital converting unit 71 receives the input signal IN with the determined voltage level and converts the input signal IN to a digital signal RS according to the determined voltage level of the input signal IN in the first period. The latch module 72 latches the digital signal RS according to a enable signal EN_2 in a second period following the first period to serve as an output signal OUT. According to the output signal OUT, the state of the input terminal $P_{IN}$ can be determined.

In this embodiment, signals have high voltage levels or low voltage levels according to a reference level. In digital, the high voltage levels correspond to logic high levels, and the low voltage levels correspond to logic low levels.

As shown in FIG. 7, the input circuit 7 further comprises a pull-down unit 73. The pull-down unit 73 is coupled between the input terminal IN and a ground voltage GND and pulls down the input terminal $P_{IN}$ to the ground voltage GND according to the output signal OUT in the second period when the input terminal $P_{IN}$ is at a floating state. The input circuit 7 also comprises a timing generating unit 74 for generating the enable signals EN_1 and EN_2. The enable signal EN_1 is complementary to the enable signal EN_2.

Referring to FIG. 7, the level-determining unit 70 comprises switches 70a and 70d and resistors 70b and 70c. The switches 70a and 70d are controlled by the enable signal EN_1. The resistor 70b is coupled to the switch 70a in series between a power voltage $V_{BAT}$ and the input terminal $P_{IN}$. The resistor 70c is coupled to the switch 70d in series between the input terminal $P_{IN}$ and the ground voltage GND. In this embodiment, resistances of the resistors 70b and 70c are equal.

Referring to FIG. 7, the analog-digital converting unit 71 comprises comparators 71a and 71b and a voltage divider 71c. The voltage divider 71c is coupled between the power voltage $V_{BAT}$ and the ground voltage GND and generates threshold voltages VTH_1 and VTH_2 controlled by the enable signal EN_1 in the first period. The voltage divider 71c comprises a switch 71d, and resistors 71e to 71g coupled in series between the power voltage $V_{BAT}$ and the ground voltage GND. The switch 71*d* is controlled by the enable signal EN_1. The threshold voltage VTH_1 is generated from a node N71*a* between the resistors 71*e* and 71*f*, and the threshold voltage VTH_2 is generated from a node N71*b* between the resistors 71*f* and 71*g*. The comparator 71*a* receives the input signal IN by a non-inverting terminal (+) and the threshold voltage VTH_1 by an inverting terminal (−). The comparator 71*a* compares the determined voltage level of the input signal IN and the voltage VTH_1 and generates a result signal RS_1 according to the compared result. The comparator 71*b* receives the input signal IN by a non-inverting terminal (+) and the threshold voltage VTH_2 by an inverting terminal (−). The comparator 71*b* compares the determined voltage level of the input signal IN and the voltage VTH_2 and generates a result signal RS_2 according to the compared result. The result signal RS_1 combines with the result signal RS_2 to form the digital signal RS. In the embodiment, each of the result signals RS_1 and RS_2 has 1 bit, and the digital signal RS thus has 2 bits.

The latch module 72 comprises latches 72*a* and 72*b*. The latch 72*a* receives the result signal RS_1 from the comparator 71*a* and latches the result signal RS_1 according to the enable signal EN_2 in the second period to serve as a latched signal OUT_1. The latch 72*b* receives the result signal RS_2 from the comparator 71*b* and latches the result signal RS_2 according to the enable signal EN_2 in the second period to serve as a latched signal OUT_2. The latched signal OUT_1 combines with the latched signal OUT_2 to form the output signal OUT. In this embodiment, each of the latched signals OUT_1 and OUT_2 has 1 bit, and the output signal OUT thus has 2 bits.

The pull-down unit 73 comprises a resistor 73*a*, switches 73*b* and 73*c*, and an XOR gate 73*d*. The resistor 73*a* and switches 73*b* and 73*c* are coupled in series between the input terminal $P_{IN}$ and a ground voltage GND. The XOR gate 73*d* receives the latched signals OUT_1 and OUT_2 (the output signal OUT) and generates an enable signal EN_3. The switch 73*b* is controlled by the enable signal EN_2, and the switch 73*c* is controlled by the enable signal EN_3.

The operation of the input circuit 7 is described with FIGS. 7 and 2. In this embodiment, all the switches are turned on by a high voltage level signal and turned off by a low voltage level signal.

Referring to FIG. 2, in a first period P_1, the power voltage $V_{BAT}$ rises from 0V and has a high voltage level, and the enable signal EN_1 rises as the power voltage $V_{BAT}$. When the enable signal EN_1 reaches to the high voltage level, the switches 70*a* and 70*d* are turned on. If the input terminal $P_{IN}$ is at a floating state, the voltage level of the input signal IN is pulled to a middle voltage level between the power voltage $V_{BAT}$ and the ground voltage GND due to the resistors 70*b* and 70*c* with the same resistances. The level-determining unit 70 thus determines the voltage level of the input signal IN as the middle voltage level. At the same time, the switch 71*d* is turned on, and it is thus obtained that the threshold voltage VTH_1 is greater than the threshold voltage VTH_2. Because the threshold voltage VTH_1 is larger than the voltage level of the input signal IN, the comparator 71*a* generates the result signal RS_1 with the low voltage level. Because the voltage level of the input signal IN is larger than the threshold voltage VTH_2, the comparator 72*a* generates the result signal RS_2 with the high voltage level.

When the power voltage $V_{BAT}$ rises to a predetermined voltage, such as 2.7V, the enable signal EN_1 switches to the low voltage level, and the enable signal EN_2 switches to the high voltage level. Referring to FIG. 2, the time at which the enable signal EN_1 switches to the low voltage level is marked as a label "TP", and a period after the time TP refers to a second period P_2. In the second period P_2, the latches 72*a* and 72*b* are triggered by the enable signal EN_2 with the high voltage level. The latch 72*a* receives and latches the result signal RS_1 with the low voltage level to serve as the latched signal OUT_1. The latch 72*b* receives and latches the result signal RS_2 with the high voltage level to serve as the latched signal OUT_2. Thus, according to the latched signal OUT_1 with the low voltage level and the latched signal OUT_2 with the high voltage level, it is obtained that the input terminal $P_{IN}$ is in the floating state.

Moreover, in the second period P_2, the XOR gate 73*d* receives the latched signal OUT_1 with the low voltage level and the latched signal OUT_2 with the high voltage level and generates the enable signal EN_3 with the high voltage level. The switch 73*b* is turned on by the enable signal EN_2 with the high voltage level, and the switch 73*c* is turned on by the enable signal EN_3 with the high voltage level. Thus, the input terminal $P_{IN}$ is pulled down to the ground voltage GND, preventing the input terminal $P_{IN}$ from floating.

If the input terminal $P_{IN}$ is in the low logic state, the input signal IN is at the low voltage level in the first period P_1. The level-determining unit 70 thus determines the voltage level of the input signal IN as the low voltage level. According to above described operations of the analog-digital converting unit 71 and the latch module 72, in the second period P_2, the latch 72*a* latches the result signal RS_1 with the low voltage level to serve as the latched signal OUT_1, and the latch 72*b* latcees the result signal RS_2 with the low voltage level to serve as the latched signal OUT_2. Thus, according to the low voltage level latched signals OUT_1 and OUT_2, it is determined that the input terminal $P_{IN}$ is in the low logic state.

In similar operations, if the input terminal $P_{IN}$ is in the high logic state, the latch 72*a* generates the result signal RS_1 with the high voltage level to serve as the latched signal OUT 1, and the latch 72*b* generates the result signal RS_2 with the high voltage level to serve as the latched signal OUT_2. Thus, according to the high voltage level latched signals OUT_1 and OUT_2, it is determined that the input terminal $P_{IN}$ is in the high logic state.

In the condition that the input terminal $P_{IN}$ is in the low and high logic states, because the XOR gate 73*d* receives the latched signals OUT_1 and OUT_2 with the high/low voltage levels, the XOR gate 73*d* generates the enable signal EN_3 with the low voltage level to turn off the switch 73*c*. Thus, the pull-down unit 73 is inactive.

In this embodiment, the timing generating unit 74 can be implemented by the timing generating unit 13' in FIG. 3 or the timing generating unit 13" in FIG. 6. In some embodiments, when the input circuit 7 is applied in an IC, the enable signals EN_1 and EN_2 are internally generated from the IC.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An input circuit, comprising
   a level-determining unit for receiving an input signal at an input terminal of the input circuit and determining a voltage level of the input signal, wherein the level-determining unit receives a reference voltage and determines the voltage level of the input signal as a voltage level of the reference voltage when the input terminal is in a floating state; and an output unit coupled to the input terminal;
wherein in a first period, the output unit outputs the input signal with the determined voltage level at an output terminal of the input circuit to serve as an output signal, the first period being controlled by a first enable signal; and
wherein in a second period following the first period, the output unit latches the determined voltage level of the input signal according to a second enable signal and outputs the input signal with the determined voltage level at the output terminal to serve as the output signal.

2. The input circuit as claimed in claim 1, wherein when the input terminal is in a low logic state, the level-determining unit determines the voltage level of the input signal as a low voltage level.

3. The input circuit as claimed in claim 1 further comprising a level keeping unit keeping a voltage value of the determined voltage level of the input signal according to the second enable signal and the output signal in the second period when the input terminal is in the floating state.

4. The input circuit as claimed in claim 1, wherein the level-determining unit comprises:
a first switch controlled by the first enable signal and having a first terminal coupled to a reference voltage and a second terminal; and
a first resistor having a first terminal coupled to the second terminal of the first switch and a second terminal coupled to the input terminal.

5. The input circuit as claimed in claim 1, wherein the output unit comprises:
a first inverter;
a second inverter coupled to the first inverter in series at a first node and between the input terminal and the output terminal;
a third inverter; a second switch controlled by the second enable signal and coupled to the third
inverter in series between the first node and the input terminal.

6. The input circuit as claimed in claim 1, wherein the first enable signal is complementary to the second enable signal.

7. The input circuit as claimed in claim 1 further comprising a first switch, a second switch, and a first resistor which are coupled in series between a reference voltage, coupled to the level-determining unit, and the input terminal.

8. The input circuit as claimed in claim 7, wherein the first switch is controlled by the output signal, and the second switch is controlled by the second enable signal.

9. The input circuit as claimed in claim 1 further comprising a timing generating unit for generating the first and second enable signals, wherein the first enable signal is complementary to the second enable signal.

10. The input circuit as claimed in claim 9, wherein the timing generating unit comprises:
a first timer for generating the first enable signal, wherein when the first timer reaches a time between the first and second periods, the first timer changes a voltage level of the first enable signal; and
a fourth inverter for receiving the first enable signal and outputting the second enable signal.

11. The input circuit as claimed in claim 9, wherein the timing generating unit comprises:
a voltage generator for receiving a power voltage and generating a first voltage according to the power voltage;
a voltage divider coupled between the power voltage and a ground voltage and generating a second voltage according to a predetermined ratio of the difference voltage between the power voltage and the ground voltage;

a comparing unit for comparing the first voltage and the second voltage, generating a result signal and a first control signal, and changing voltage levels of the result signal and the first control signal according to the compared result;
a second timer for generating a second control signal, wherein when the second timer reaches a time between the first and second periods and the comparing unit does not change the voltage level of the first control signal, the second timer changes a voltage level of the second control signal; and
a multiplexer for receiving the power voltage and the result signal and outputting the power voltage or the result signal to serve as the first enable signal according to the voltage levels of the first and second control signals.

12. An input circuit, comprising
a level-determining unit for receiving an input signal at an input terminal of the input circuit and determining a voltage level of the input signal in a first period, the first period being controlled by a first enable signal;
an analog-digital converting unit for receiving the input signal with the determined voltage level and converting the input signal to a digital signal according to the determined voltage level of the input signal in the first period; and
a latch module for latching the digital signal according to a second enable signal in a second period following the first period to serve as an output signal.

13. The input circuit as claimed in claim 12, wherein a state of the input terminal is determined according to the output signal.

14. The input circuit as claimed in claim 12, wherein the level-determining unit is coupled between a power voltage and a ground voltage and determines the voltage level of the input signal as a level between the power voltage and the ground voltage when the input terminal is in a floating state.

15. The input circuit as claimed in claim 14 further comprising a pull-down unit coupled between the input terminal and the ground voltage and pulling down the input terminal to the ground voltage according to the output signal in the second period when the input terminal is in the floating state.

16. The input circuit as claimed in claim 12, wherein the level-determining unit comprises:
a first switch for controlled by the first enable signal;
a first resistor for coupled to the first switch in series between a power voltage and the input terminal;
a second switch for controlled by the first enable signal;
a second resistor for coupled to the second switch in series between the input terminal and a ground voltage.

17. The input circuit as claimed in claim 12, wherein the analog-digital converting unit comprises:
a first voltage divider for coupled between a power voltage and a ground voltage and generating a first threshold voltage and a second threshold voltage according to the first enable signal in the first period;
a first comparator for receiving the input signal and the first threshold voltage, comparing the determined voltage level of the input signal and the first voltage, and generating a first result signal according to the compared result; and
a second comparator for receiving the input signal and the second threshold voltage, comparing the determined voltage level of the input signal and the second voltage, and generating a second result signal according to the compared result, wherein the first result signal combines with the second result signal to form the digital signal.

18. The input circuit as claimed in claim 12, wherein the first enable signal is complementary to the second enable signal.

19. The input circuit as claimed in claim 12 further comprising a first switch, a second switch, and a first resistor coupled in series between the input terminal and a ground voltage.

20. The input circuit as claimed in claim 19, wherein the first switch is controlled by the second enable signal, and the second switch is controlled by a third enable signal obtained by logically calculating the output signal.

21. The input circuit as claimed in claim 12 further comprising a timing generating unit for generating the first and second enable signals, wherein the first enable signal is complementary to the second enable signal.

22. The input circuit as claimed in claim 21, wherein the timing generating unit comprises:
   a first timer for generating the first enable signal, wherein when the first timer reaches a time between the first and second periods, the first timer changes a voltage level of the first enable signal; and
   a first inverter for receiving the first enable signal and outputting the second enable signal.

23. The input circuit as claimed in claim 21, wherein the timing generating unit comprises:
   a voltage generator for receiving a power voltage and generating a first voltage according to the power voltage;
   a second voltage divider coupled between the power voltage and a ground voltage and generating a second voltage according to a predetermined ratio of the difference voltage between the power voltage and the ground voltage;
   a comparing unit for comparing the first voltage and the second voltage, generating a third result signal and a first control signal, and changing voltage levels of the third result signal and the first control signal according to the compared result;
   a second timer for generating a second control signal, wherein when the second timer reaches a time between the first and second periods and the comparing unit does not change the voltage level of the first control signal, the second timer changes a voltage level of the second control signal; and
   a multiplexer for receiving the power voltage and the third result signal and outputting the power voltage or the third result signal to serve as the first enable signal according to the voltage levels of the first and second control signals.

24. A method for an input circuit having an input terminal, comprising:
   receiving a reference voltage;
   determining a voltage level of an input signal at the input terminal, wherein the voltage level of the input signal is determined as a voltage level of the reference voltage when the input terminal is in a floating state;
   latching the determined voltage level of the input signal;
   outputting the input signal with the determined voltage level to serve as an output signal; and
   determining a state of the input terminal according to the output signal.

* * * * *